United States Patent [19]

Park et al.

[11] Patent Number: 5,560,778
[45] Date of Patent: Oct. 1, 1996

[54] APPARATUS FOR FORMING A DIELECTRIC LAYER

[75] Inventors: In-Seon Park; Myoung-Bum Lee; Chang-Gee Hong, all of Seoul; Chang-Gyu Kim, Seongnam; U-In Chung, Suwon, all of Rep. of Korea

[73] Assignee: Samsung Electronics Co., Ltd., Suwon, Rep. of Korea

[21] Appl. No.: 465,015

[22] Filed: Jun. 5, 1995

Related U.S. Application Data

[62] Division of Ser. No. 296,931, Aug. 31, 1994.

[30] Foreign Application Priority Data

Aug. 31, 1993 [KR] Rep. of Korea ............... 93-17552

[51] Int. Cl.⁶ ..................................... C23C 16/00
[52] U.S. Cl. ........................... 118/723 E; 118/723 R
[58] Field of Search ................. 118/723 E, 723 R

[56] References Cited

U.S. PATENT DOCUMENTS 5,110,619  5/1992  Ogumi et al. ............... 118/723 E
5,221,416  6/1993  Kishi et al. ................. 118/723 E
5,366,555  11/1994  Kelly ......................... 118/723 E
5,456,757  10/1995  Aruga et al. ................ 118/723 E Primary Examiner—R. Bruce Breneman
Assistant Examiner—Ramamohan Rao Paladugu
Attorney, Agent, or Firm—Cushman Darby & Cushman, L.L.P.

[57] ABSTRACT

A deposition rate of a dielectric material is varied with the electrical polarity of an underlying layer to obtain excellent deposition and planarization characteristics. A conductive layer and the underlying dielectric are surface-treated to have different electrical polarities so that the dielectric is formed by using the difference of deposition rates of the dielectric material between that on the conductive layer and that on the underlying dielectric. A CVD apparatus having a DC power source connected between a susceptor and a gas injection portion thereof is provided. The deposition and planarization can be performed at low temperatures and are simplified in process.

2 Claims, 9 Drawing Sheets

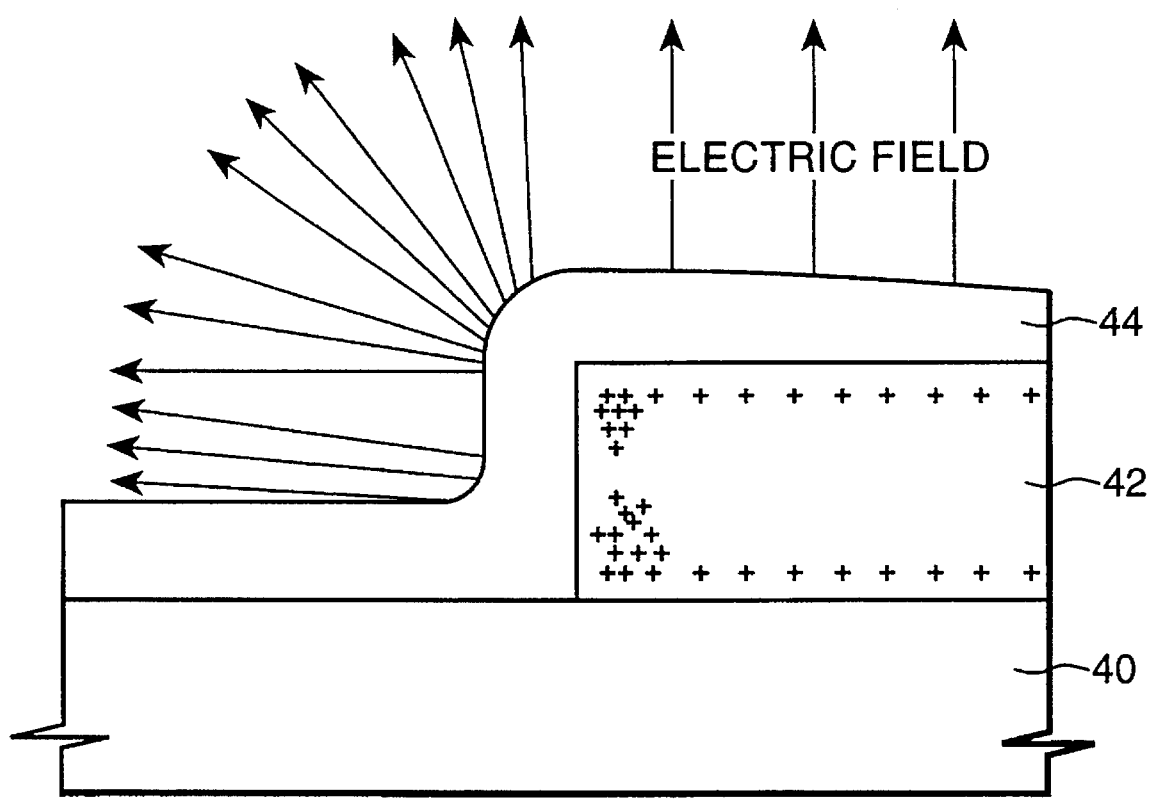

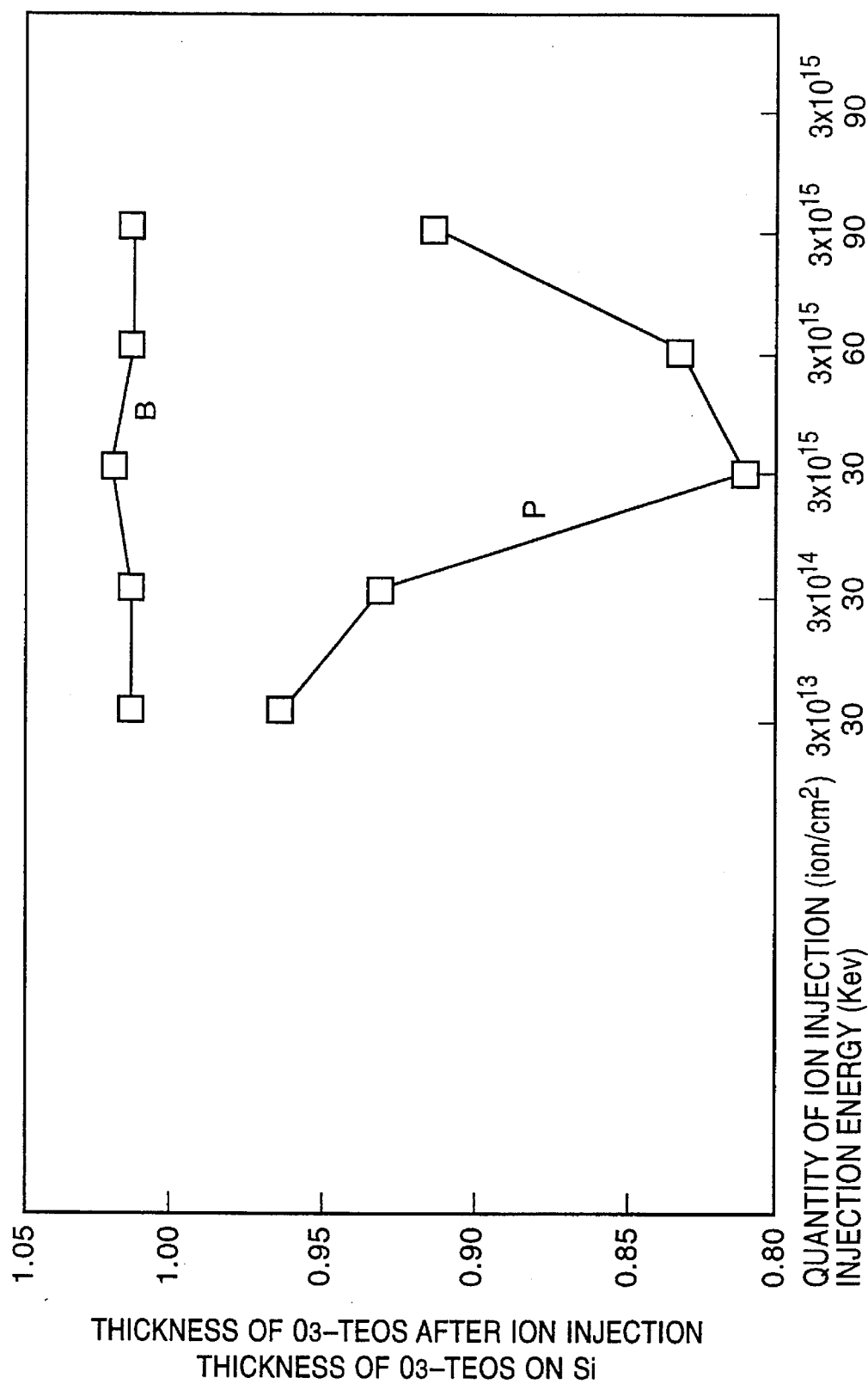

5,560,778

APPARATUS FOR FORMING A DIELECTRIC LAYER

This is a division of application Ser. No. 08/296,931 filed Aug. 31, 1994.

BACKGROUND OF THE INVENTION

The present invention relates to a method of manufacturing a semiconductor device and an apparatus for manufacturing the same. More particularly, the present invention relates to a method of forming a planarized dielectric layer for a semiconductor device and an apparatus for forming the same.

The planarizing of an interlayer dielectric formed between metal wiring layers or formed prior to a metallization process has become increasingly important as the semiconductor industry continues to manufacture semiconductor devices having higher packing densities and having conductive layers divided into a multitude of layers.

FIGS. 1A, 1B and 1C sequentially illustrate a process of forming and planarizing an interlayer dielectric according to a conventional method.

Referring to FIG. 1A, a first dielectric 12 is formed on a semiconductor substrate 11. A conductive material of a relatively high melting point, e.g., polysilicon, poly+WSi or W, is then deposited and patterned thereon to form a conductive layer 13.

Referring to FIGS. 1B and 1C, a flowable insulating material such as borophosphosilicate glass (BPSG) is coated on the resultant structure, to thereby form a second dielectric layer 14. The second dielectric layer 14 is thermally treated at a temperature over 800° C. so that the second dielectric layer 14 reflows. The reflow of the second dielectric 14 planarizes the surface thereof.

Such a conventional process for planarizing an interlayer dielectric has a disadvantage in that the reflow process requires a high temperature thermal treatment. This high temperature treatment destroys the junction of an impurity layer formed on the underlying semiconductor substrate 11.

FIGS. 2A, 2B, 2C and 2D sequentially illustrate a process of forming and planarizing a dielectric layer according to another conventional method.

Referring to FIG. 2A, a first dielectric layer 22 is formed on a semiconductor substrate 21. A conductive material of a relatively low melting point, such as aluminum, is coated on the first dielectric layer 22 and patterned to thereby form a conductive layer 23. The conductive layer 23 is a metal wiring layer.

Referring to FIG. 2B, an insulating material is coated on the resultant structure, to thereby form a second dielectric layer 24. The second dielectric layer 24 insulates the conductive layer 23.

Referring to FIGS. 2C and 2D, spin-on glass (SOG) 25 is coated on second dielectric layer 24 and etched back until the top portions of the second dielectric layer 24 over the conductive layer 23 are exposed, leaving SOG 25 only in recessed portions of the second dielectric layer 24 between the metal wiring of the conductive layer 23. Therefore, the metal wiring of the conductive layer 23 is planarized with the interlayer dielectric comprised of the second dielectric layer 24 and the layer of SOG 25.

The second conventional planarization process suffers from a disadvantage in that it involves complicated processes.

Dielectric materials such as an $O_3$-tetraethylorthosilicate (TEOS) or $O_3$-hexamethyldisiloxane (HMDS) oxide layer are now used expansively because these oxide materials exhibit far better conformality than does a more conventional oxide layer of silane ($SiH_4$). The above mentioned dielectric materials have a surface dependence effect in which a deposition rate varies in accordance with the properties of the material of the underlying layer. The surface dependence effect hinders the control of the formation of the dielectric material layer to a uniform thickness, according to the properties of the underlying material layer. The surface dependence effect also lowers the deposition rate and gives the dielectric layer a porous film structure. These problems degrade the quality of the dielectric layer.

A $O_3$-TEOS oxide layer has the surface dependence effect during growth when the material of the underlayer is made of silicon, BPSG or aluminum (see Nishimoto et al., "A Preview for the Fiftieth Scientific Lectures" Applied Physics Society, 1989, 30a-D-3, p. 673).

Japanese Laid-open Patent Publication No. Hei 1-206631 suggests a method of depositing a plasma-TEOS oxide layer or plasma-$SiH_4$ oxide layer on the overall surface of the underlying material prior to forming the $O_3$-TEOS oxide layer in order to reduce the surface dependence effect thereof.

The effect in which a deposition rate varies according to the property of the underlying material is believed to vary depending on whether the underlying material is hydrophilic or hydrophobic. However, this speculation does not explain the phenomenon in which the deposition rate of the $O_3$-TEOS oxide layer varies with the density of the wiring of an underlying conductive layer. FIGS. 3A, 3B, 3C and 3D are diagrams for explaining this phenomenon.

FIG. 3A illustrates a conductive layer. A first pad 42 is connected to a fine metal wire 41 of the conductive layer, and a second pad 43 of the conductive layer is not connected thereto. FIGS. 3B and 3C show that the dielectric material formed on the conductive layer shown in FIG. 3A results in different deposition characteristics between the dielectric layer formed on the first pad 42 and that formed on the second pad 43.

FIG. 3B illustrates the deposition of an $O_3$-TEOS oxide layer 45 formed on the first pad 42 of the conductive layer, which is connected to the fine metal wire 41. A plasma-oxide layer 44 is deposited on the surface of the first pad 42 formed on a dielectric layer 40 formed of BPSG. An $O_3$-TEOS oxide layer 45 is formed thereafter over the resultant structure. FIG. 3B shows that the $O_3$-TEOS oxide layer forms peaks 45a along the edges of the underlying first pad 42.

FIG. 3C illustrates the deposition of an $O_3$-TEOS oxide layer 45 formed on the second pad 43 of the conductive layer, which is not connected to the fine metal wire 41. The $O_3$-TEOS oxide layer formed on the second pad 43 produces a peak 45b which is much smaller than the peak 45a produced on the first pad 42. It is believed that this is due to the fact that, as shown in FIG. 3A, electric charge distributions on the pads vary depending upon whether or not it is connected to the metal wire 41. The interaction (repulsion) between electric charges of adjacent metal wires 41 causes the electric charge variations. Therefore, the shape of the $O_3$-TEOS oxide layer formed on the first and second pads 42, 43 varies.

FIG. 3D shows the electrical field which is formed due to the electric charge distribution of the first pad 42, which is connected to the fine metal wire 41. The interaction between the electric charges of a plurality of fine metal wires 41 becomes stronger as the line spacing between the fine metal wires 41 becomes narrower. Thus, the amount of charges accumulated on the first pad 41 increases. Accordingly, the strength of the electrical field surrounding the first' pad 42 increases. Therefore, the phenomenon of the variation of the deposition rate in accordance with the density of an underlying metal wire may be explained as being related to the electric charge distribution of the metal wire.

The cause of this phenomenon was closely examined. The kind and amount of charges conducted on the surface of the underlying material were varied with a deposition of an $O_3$-TEOS oxide layer. For this experiment, the $O_3$-TEOS oxide layer was deposited after B ions (trivalent) and P ions (pentavalent) were implanted on the silicon wafer in different amounts and energies.

FIG. 4 is a graph showing that the deposition rate of the $O_3$-TEOS oxide layer varied with the electrical polarity of the surface of the underlying layer.

Referring to FIG. 4, if B ions are implanted, the deposition rate of the $O_3$-TEOS oxide layer is high in any case, as compared with when no ions are implanted. On the other hand, if P ions are implanted, the deposition rate of the $O_3$-TEOS oxide layer is lowered as the ion implantation amount increases, and the deposition rate increases with greater ion energy levels.

An analysis of these results shows that, when positive charges (such as B ions) are produced on the silicon wafer, the deposition rate of the oxide layer is raised. However, when negative charges (such as P ions) are produced, the deposition rate of the oxide layer is lowered. Therefore, the deposition rate of the $O_3$-TEOS oxide layer varies with the strength and the electrical polarity of the surface of the underlying layer.

This analysis explains the variation of the deposition form of the oxide layer with the density of the underlying metal wiring. The higher energy levels result in a higher deposition rate because the P ions are implanted more deeply and away from the surface of the wafer, so that the ion implantation effect is weakened.

An improvement of the above-mentioned Japanese patent publication has been suggested wherein a dielectric is formed between metal wires (see Kurt Kwok et al., VMIC, Jun. 8 and 9, 1993, p.142). In an attempt to overcome the surface dependence effect, this method proposes that a plasma-enhanced chemical vapor deposition (PECVD) oxide layer be formed on a conductive layer of aluminum. The surface of the PECVD oxide layer is plasma-treated with nitrogen ($N_2$), argon or hydrogen ($H_2$) gas, and then the $O_3$-TEOS oxide layer is deposited thereon. The plasma treatment produces an abundance of positive ions on the surface of the underlying PECVD oxide layer, and the $O_3$-TEOS gas phase mixture has a lot of oxygen atoms which hold negative charges so that the positive ions and negative ions exhibit the electrical attraction therebetween. FIGS. 5A–5D sequentially illustrate the conventional process of forming a dielectric between metal wires proposed by Kurt Kwok et al.

Referring to FIGS. 5A–5D, a first dielectric layer 28 is formed on a semiconductor substrate 27. A conductive material having a relatively low melting point, such as aluminum, is coated on the first dielectric layer 28 and patterned so as to form a conductive layer 29. A PECVD oxide material is coated on the resultant structure, thereby forming a second dielectric layer 30. The surface of the second dielectric layer 30 is plasma-treated with $N_2$, argon or $H_2$ gas. An $O_3$-TEOS oxide layer is coated on the resultant structure, to thereby form a third dielectric layer 31.

The results of the method proposed by Kurt Kwok et al. conform with the experimental result and theories explained above, i.e. the surface dependence effect of the $O_3$-TEOS oxide layer is related to the electrical polarity of the underlying layer. However, since the PECVD oxide layer must be formed on the conductive layer, the method proposed by Kurt Kwok et al. involves a complicated process without any guarantee of the planarization of the surface of the formed dielectric layer.

The present invention contemplates a surface dependence effect of a dielectric layer in an organic relationship with the conductive layer. With such contemplation and realization, the problems associated with the conventional methods and apparatus' is overcome by a simplified process and planarization.

SUMMARY OF THE INVENTION

Therefore, it is an object of the present invention to provide a method of forming a dielectric having improved deposition rate characteristics.

It is another object of the present invention to provide a method of forming a dielectric layer wherein a manufacturing process therefor is simplified and performed at a relatively low temperature and wherein an excellent planarization effect is exhibited.

It is still another object of the present invention to provide an apparatus for manufacturing a semiconductor device which is applied to the performance of the above-described method of forming a dielectric.

To accomplish these and other objects of the present invention, a method of forming a dielectric layer is provided comprising the steps of: (a) forming a first material layer on the surface of a substrate; (b) treating the first material layer whose surface thereby has an electrical polarity; and (c) depositing a second material whose intermediate product has an electrical polarity opposite that of the surface of the treated first material, on the first material layer, thereby forming a second material layer.

The present invention takes advantage of a phenomenon in which the deposition rate of an $O_3$-TEOS oxide layer varies with the electrical polarities of the surface of an underlying wiring layer and the surface of an underlying dielectric layer, during the growth of the $O_3$-TEOS oxide layer. When a dielectric layer is formed of a dielectric material whose intermediate product has an electrical polarity during the formation thereof, such as an $O_3$-TEOS oxide layer or an $O_3$-HMDS oxide layer, the electrical polarity of the surface of an underlying layer is set to be opposite that of the dielectric material. This raises the deposition rate by the electrical attraction of the materials and therefore enhances the deposition characteristic of the dielectric material.

For instance, if an $O_3$-TEOS oxide layer whose intermediate product is electrically negative is used as the dielectric material, the surface of an underlying layer is treated to be electrically positive. To treat the surface of the underlying layer, a DC power source is provided which is connected to electrically polarize the underlying layer. Another method of treating the surface of the underlying layer is plasma-treating, and yet another method is to implant ions into the underlying layer.

A method is also provided of forming a dielectric comprising the steps of: (a) coating and patterning a conductive material on a underlying dielectric, thereby forming a conductive layer while exposing part of the underlying dielectric layer; (b) treating the conductive layer and the underlying dielectric layer so that the electrical polarities of the surface of the conductive layer and the surface of the exposed underlying dielectric layer are different; and (c) depositing a dielectric material whose deposition rate varies with the electrical polarity of the surface of the treated conductive layer and the surface of the treated underlying dielectric.

When a second dielectric layer is formed on both a conductive layer and a first dielectric layer, which underlies the conductive layer, and the conductive layer is patterned to expose portions of the underlying first dielectric layer, the electrical polarities of the surface of the conductive layer and of the surface of the underlying first dielectric layer are treated to be different. This varies the deposition rates of the second dielectric layer formed on the conductive layer and on the underlying first dielectric layer to obtain an improved planarization of the second dielectric layer.

For instance, when an $O_3$-TEOS oxide layer whose intermediate product is electrically negative is used as a dielectric material, the surface of the conductive layer is treated to be negative and the surface of the underlying first dielectric layer is treated to be positive. Therefore, when the second dielectric layer is formed, the deposition rate of the second dielectric formed on the underlying first dielectric layer is raised by the electrical attraction between the underlying first dielectric layer and the intermediate product. The deposition rate on the conductive layer is lowered by the electrical repulsion therebetween. This enables the interlayer second dielectric layer to be generally planar.

A difference of the electrical polarity between the surface of the conductive layer and the surface of the underlying first dielectric layer can be made possible in various ways. For instance, if the $O_3$-TEOS oxide layer whose intermediate product is electrically negative is used as the dielectric material, the surface of the conductive layer may be set to have no electrical polarity and only the surface of the underlying first dielectric layer may be set to be positive. This provides that the oxide layer on the conductive layer has a typical deposition rate and the oxide layer on the underlying first dielectric layer has a relatively high deposition rate. If the surface of the conductive layer is negative, the surface of the underlying first dielectric layer can be set to have no electrical polarity. If, on the other hand, the deposited dielectric material is electrically positive and therefore opposite to the polarity of the $O_3$-TEOS oxide layer, the electrical polarities of the surface of the conductive layer and the surface of the underlying first dielectric layer should be treated to be opposite those in the above-described case. The conductive layer and the surface of the underlying first dielectric layer can be treated to have electrically different polarities using any appropriate method. For instance, using a DC power source, plasma treatment and/or ion implantation.

To accomplish the third object of the present invention, a CVD apparatus is provided wherein a DC power source is connected between a susceptor on which a wafer is attached and a gas injection portion.

BRIEF DESCRIPTION OF THE DRAWINGS

The above objects and advantages of the present invention will become more apparent by the detailed description of a preferred embodiment thereof with reference to the attached drawings, in which:

FIGS. 3A, 3B, 3C and 3D are views for explaining differences in deposition characteristics of an $O_3$-TEOS oxide layer according to the density of an underlying metal wire conductive layer;

FIG. 4 is a graph showing the variation of deposition rate of the $O_3$-TEOS oxide layer after ion injection;

DESCRIPTION OF THE PREFERRED EMBODIMENTS

Figure 1A:
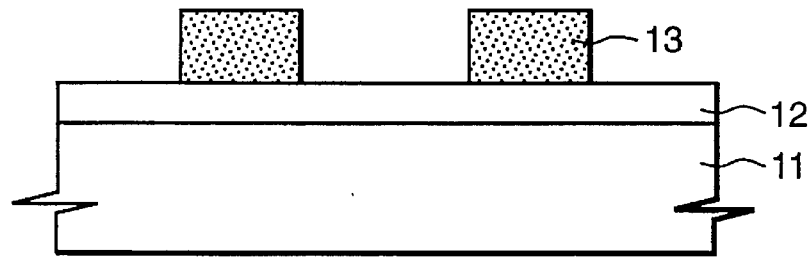
FIGS. 1A, 1B and 1C sequentially illustrate processes of forming and planarizing an interlayer dielectric layer according to a conventional method.
Figure 1B:
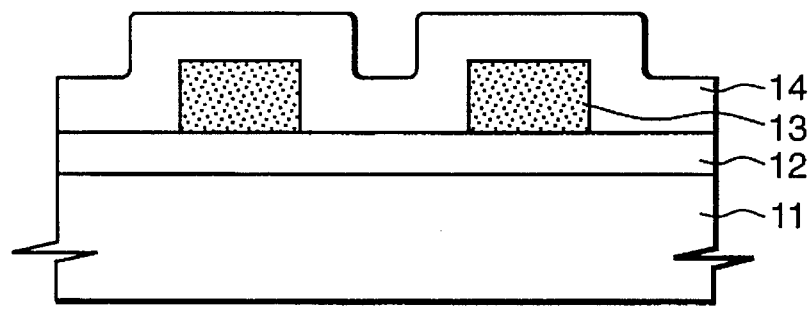
Figure 1C:
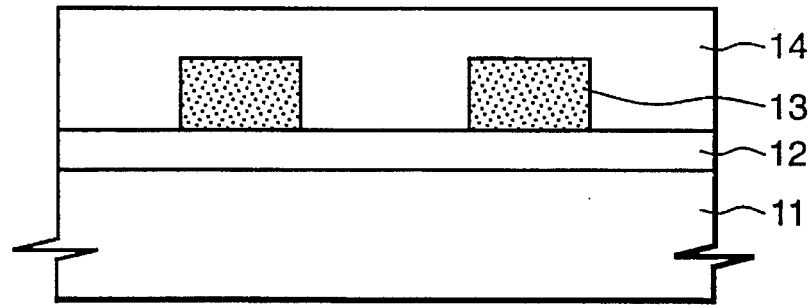
Figure 2A:
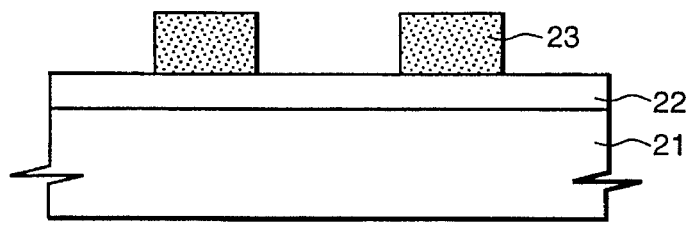
FIGS. 2A, 2B, 2C and 2D sequentially illustrate a process of forming and planarizing an interlayer dielectric layer according to another conventional method.
Figure 2B:
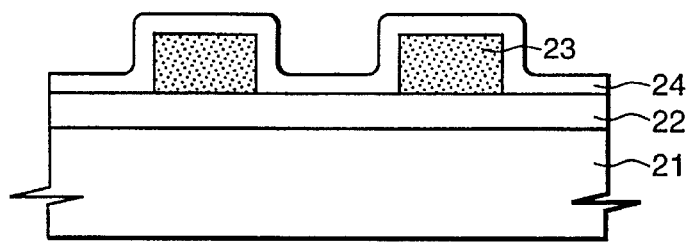
Figure 2C:
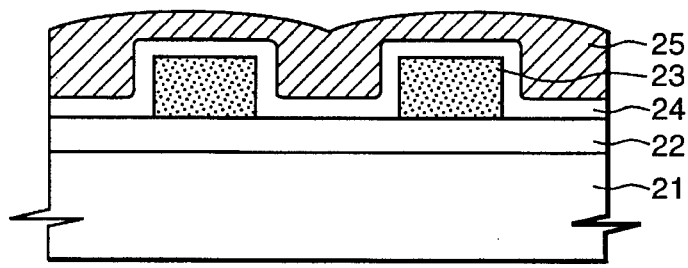
Figure 2D:
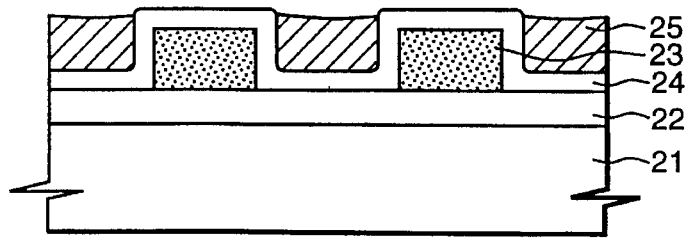
Figure 3A:
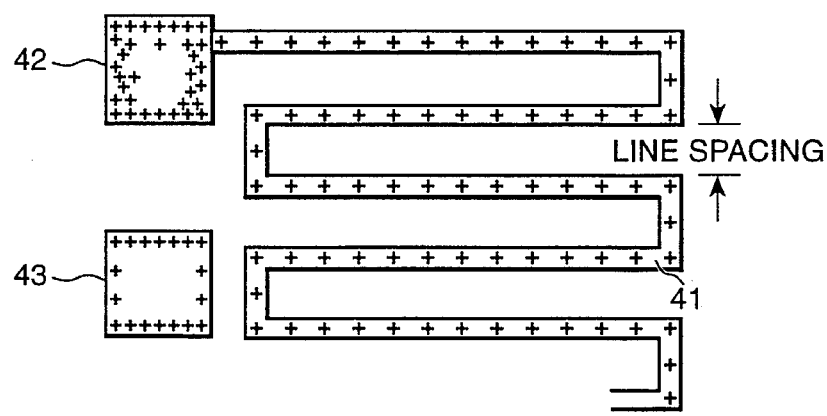
Figure 3B:
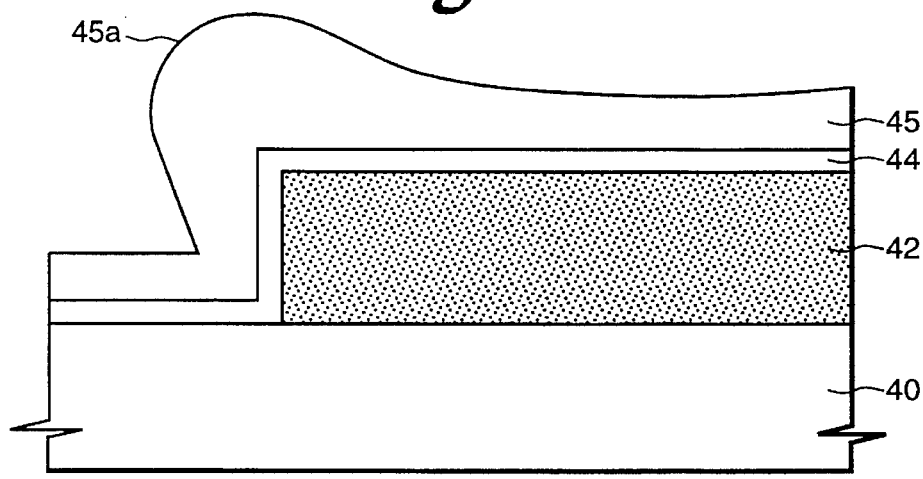
Figure 3C:
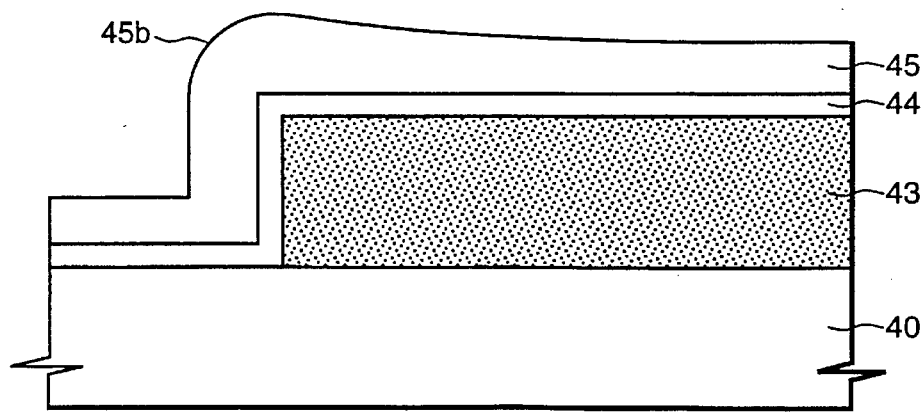
Figure 5A:
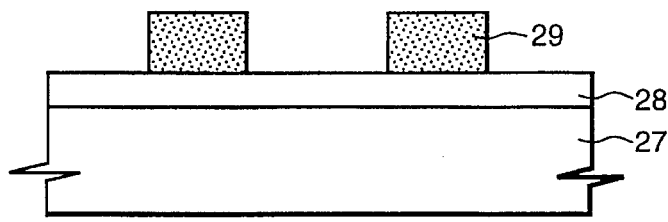
FIGS. 5A, 5B, 5C and 5D sequentially illustrate a conventional process of forming a dielectric layer using the $O_3$-TEOS oxide layer.
Figure 5B:
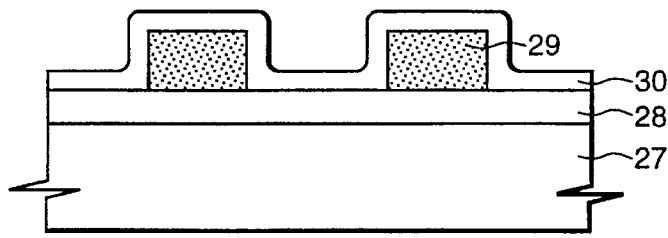
Figure 5C:
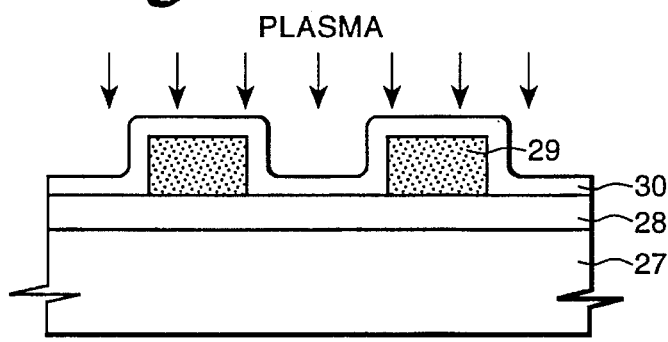
Figure 5D:
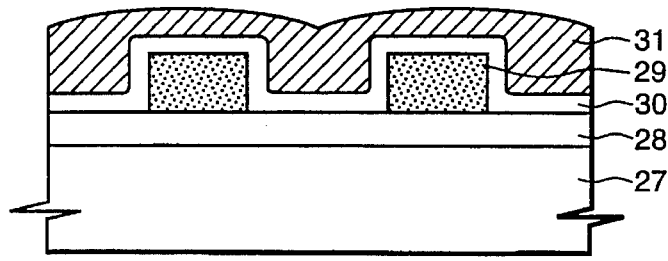
Figure 6A:
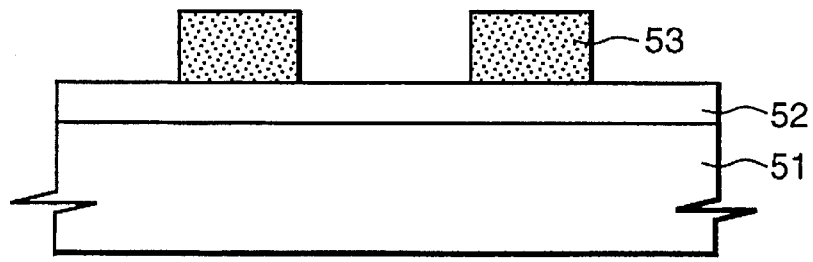
FIGS. 6A, 6B and 6C sequentially illustrate one embodiment of a method of forming a dielectric layer of the present invention.

Referring to FIG. 6A, an underlying dielectric layer 52 made of BPSG is formed on a semiconductor substrate 51. Tungsten silicide and doped polysilicon are deposited to thicknesses of about 1,500 Å and about 500 Å, respectively, on the underlying dielectric layer 52, and then patterned to form a conductive layer 53.

Figure 6B:
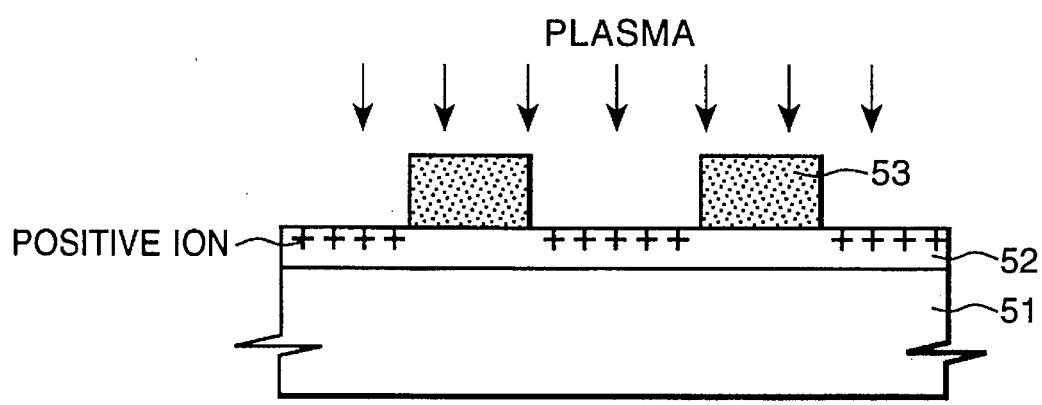

Referring to FIG. 6B, the resultant structure is plasma-treated with $N_2+NH_3$. The conditions for the plasma treatment are 100 seconds in processing time, 2.5 torr in pressure, 400 Watts in power, 400° C. in temperature, 350 mils in spacing, 2,200 ccm in $N_2$ flow rate, and 80 ccm in $NH_3$ flow rate. The $N_2+NH_3$ plasma can be replaced with $N_2$, $N_2O$, $O_2$, $O_3$ or argon plasma. The plasma treatment is for the purpose of holding positive the surface of the underlying dielectric layer 52 exposed between the pattern of the conductive layer 53. Since the intermediate product of the $O_3$-TEOS oxide layer to be used as the material for the dielectric in a later process of forming the interlayer dielectric layer 54 is negative, the plasma treatment for holding positive the surface of the underlying dielectric layer makes the deposition rate of the exposed underlying dielectric layer 52 greater than that of the conductive layer 53.

An ion injection method can be employed for such plasma treatment, which manifests the same effect as the plasma treatment does. Specifically, when the conductive layer 53 is formed and then positive ions are implanted on the resultant structure, the ions implanted into the conductive layer 53 are neutralized by the electrons abundantly present inside the conductive layer. The ions implanted into the underlying dielectric layer 52 render the surface of the underlying dielectric layer 52 positive.

Figure 6C:
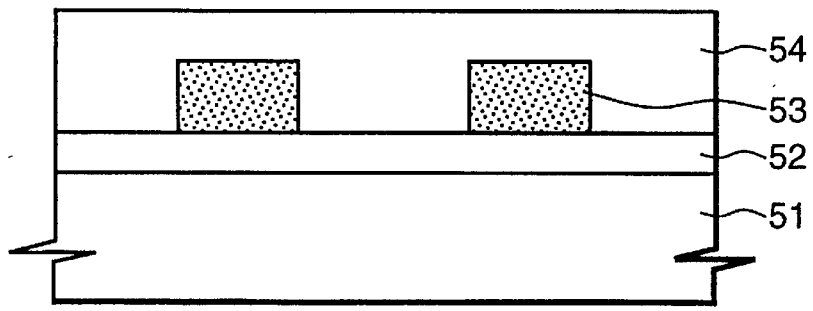

Referring to FIG. 6C, $O_3$-TEOS undoped silicate glass is deposited to a thickness of 3,000 Å on the resultant structure which has been plasmatreated, thereby forming interlayer dielectric layer 54. This interlayer dielectric layer 54 has an excellent planarization because of differences between the deposition rate of the $O_3$-TEOS oxide layer on the underlying dielectric layer 52 and on the conductive layer 53. Other materials such as an $O_3$-HMDS oxide layer, with its intermediate product bearing an electrical polarity, can be used for the $O_3$-TEOS oxide layer.

The plasma treatment is performed in a state wherein the conductive layer and the underlying dielectric layer have opposite polarities. When the wafer is charged with a negative polarity, positive ions in a plasma state are injected into the conductive layer and underlying dielectric layer having opposite polarities. Thus, the underlying dielectric layer is charged with positive ions. The positive ions are also injected on the conductive layer. However, since the conductive layer has been negatively charged, the ions implanted into the conductive layer are neutralized by the abundance of electrons in the conductive layer. Therefore, the conductive layer and the underlying dielectric layer are treated to have opposite polarities by the same plasma treatment.

Though the concept of the present invention is applied to form a second interlayer dielectric layer on a conductive layer and an underlying first dielectric layer, the basic concept of the present invention can also be employed in any process of forming a dielectric.

Figure 7B:
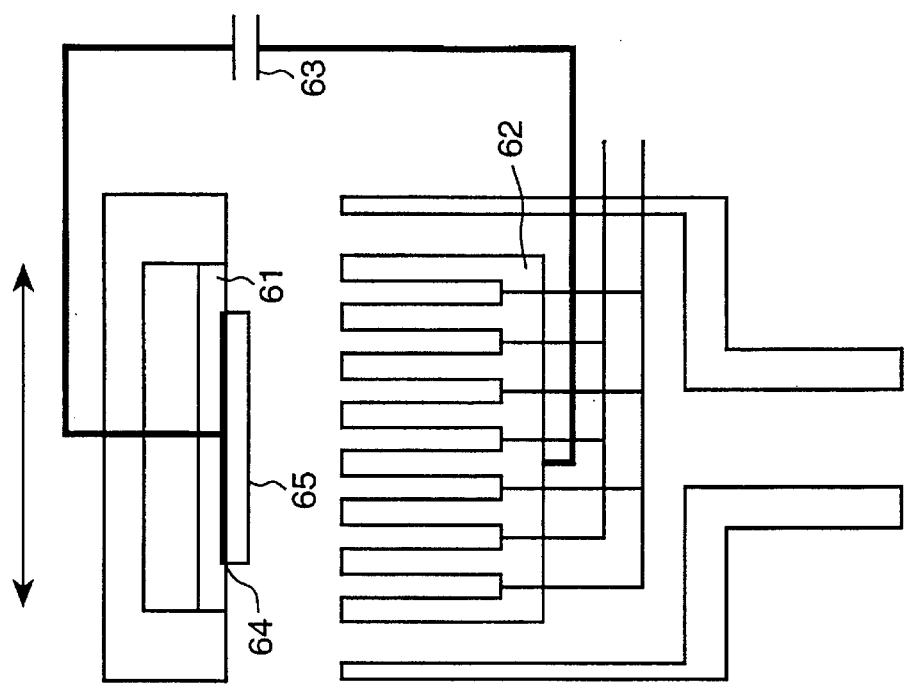
FIGS. 7A and 7B are views of an apparatus for manufacturing a semiconductor device according to the present invention.
Figure 7A:
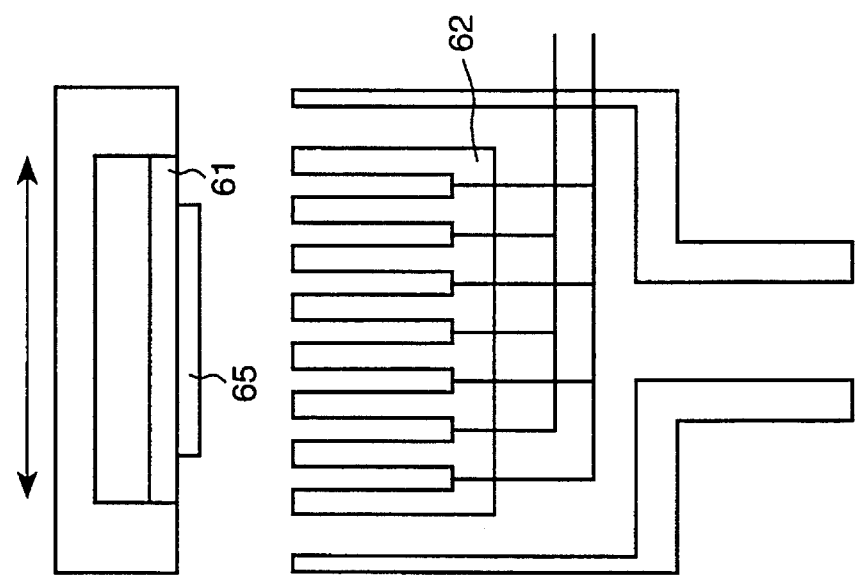

FIGS. 7A and 7B illustrate an apparatus for manufacturing a semiconductor device using the method of forming a dielectric of the present invention. FIG. 7A depicts a conventional CVD apparatus and FIG. 7B shows a CVD apparatus according to the present invention. In the conventional CVD apparatus shown in FIG. 7A, a wafer 65 is attached directly on a susceptor 61. The conventional CVD apparatus has no means for electrically connecting the susceptor and a gas injection portion therebetween. However, the CVD apparatus of the present invention, shown in FIG. 7B, provides a DC power source 63 between the susceptor 61 and the gas injection portion 62. The DC power source 63 electrically connects the susceptor 61 to the gas injection portion 62. The wafer 65 is then placed on a conductive plate 64 which is attached to the susceptor 61.

The DC power source 63 is applied across the susceptor 61 and gas injection port 62, and the wafer 65 is attached directly onto the susceptor. With a voltage applied via the DC power source 63, the wafer is charged with either a positive polarity or a negative polarity, and the conductive layer is charged accordingly. The underlying dielectric layer is not charged since it is an insulator. Therefore, when the conductive layer is charged with the negative polarity, the underlying dielectric layer receives a relatively positive charge, so that the conductive layer and the underlying dielectric layer have opposite polarities.

An insulating material whose intermediate product becomes negative, such as $O_3$-TEOS, is deposited on a blank wafer using the CVD apparatus of the present invention. If the positive electrode of the DC power source 63 is coupled to the susceptor 61, positive ions are produced on the surface of the wafer 65 thereby increasing the deposition rate of the $O_3$-TEOS to form an $O_3$-TEOS oxide layer, due to electrical attraction. If the negative electrode of the DC power source 63 is connected to the susceptor 61, negative ions are created on the surface of the wafer 65 so that the deposition rate of the $O_3$-TEOS is lowered due to the electrical repulsion. Therefore, apparatus according to the present invention enables control of the deposition rate of the dielectric as necessary, and provides for the formation of a dielectric with excellent deposition characteristics.

Figure 8B:
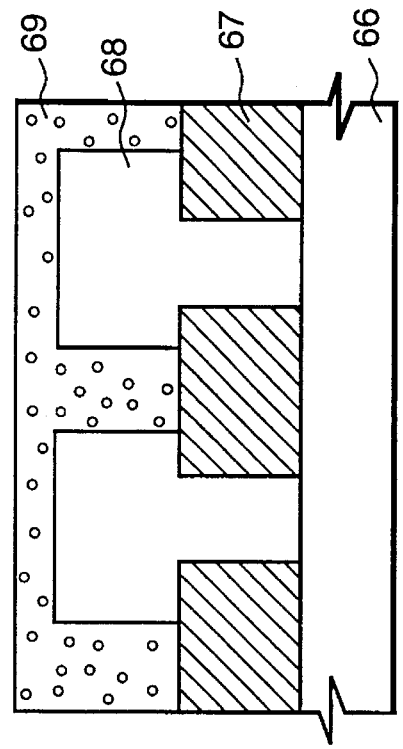
FIGS. 8A and 8B are cross-sectional views showing a method of forming an interlayer dielectric layer using the apparatus of FIG. 7B.
Figure 8A:
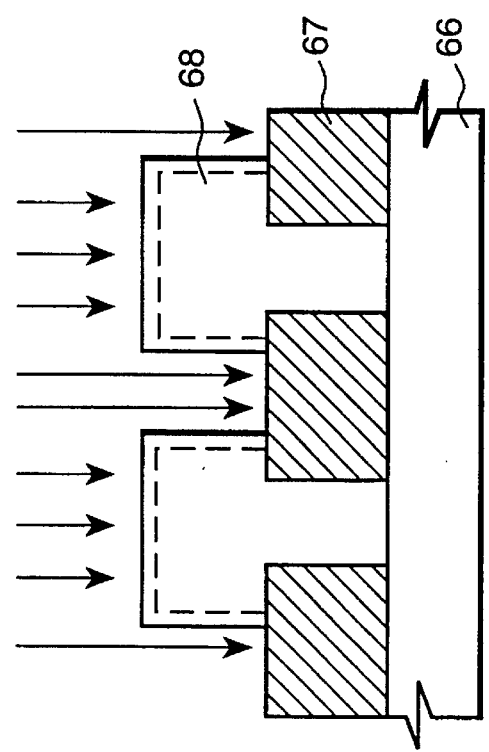

Referring to FIGS. 8A and 8B, the CVD apparatus of the present invention is used in order to form an interlayer dielectric layer according to the method described above. A first dielectric is formed on a semiconductor substrate 66 and patterned to form a first dielectric layer 67. A conductive layer 68 is formed on the first dielectric layer 67. A second dielectric layer is then formed on the conductive layer 68 and the exposed portions of the first dielectric layer 67. The second dielectric is made of such a material as $O_3$-TEOS to form an $O_3$-TEOS oxide layer. If the negative electrode of the DC power source 63 is connected to the susceptor 61, the surface of the conductive layer 68 becomes negative as shown in FIG. 8A so that the deposition rate of the $O_3$-TEOS oxide layer is lowered thereon, and the deposition rate of the $O_3$-TEOS oxide layer is normal on the underlying dielectric layer 67. The deposition rate of the $O_3$-TEOS oxide layer 69 on the conductive layer 68 is thereby different from that on the underlying dielectric layer 67. This provides for the formation of a very planar interlayer dielectric layer.

Although the above-explained embodiment of the present invention is exemplified in a case where the dielectric layer is formed of a material whose intermediate product is electrically negative, such as the $O_3$-TEOS oxide layer, the present invention is applicable to processes of depositing a material having an electrical polarity (including a positive polarity) as well as processes of forming a dielectric.

As described above, the method of the present invention enables a dielectric to have a high deposition rate and excellent deposition characteristics. Furthermore, the present invention provides a method and apparatus for obtaining a dielectric layer formed between a metal wiring conductive layer or an interlayer dielectric layer prior to metallization with a simplified process. The present invention provides a method for forming an interlayer dielectric which exhibits an excellent degree of planarization and no junction destruction caused by a high thermal treatment. In addition, the CVD apparatus of the present invention facilitates the process of forming a dielectric.

While the invention has been particularly shown and described with reference to a preferred embodiment and alterations thereto, it is to be understood by those skilled in the art that various changes in form and detail may be made therein without departing from the spirit and scope of the invention.

What is claimed is:

1. A semiconductor manufacturing CVD apparatus, comprising:

a susceptor for supporting a substrate on which a first material is deposited;

a gas injection portion for depositing on said first material a second material having a property of being polarized by a first electrical polarity; and a DC power source connected between said susceptor and said gas injection portion to charge said first material to be polarized by a second electrical polarity being opposite to said first electrical polarity, to thereby enable said second material to be deposited over said first material such that a resultant top surface of said deposited second material is relatively smooth.

2. A semiconductor manufacturing CVD apparatus according to claim 1, wherein said second material is selected from the group consisting of $O_3$-TEOS oxide and $O_3$-HMDS oxide.

* * * * *